US006628213B2

(12) United States Patent
Nagata (10) Patent No.: US 6,628,213 B2
(45) Date of Patent: Sep. 30, 2003

(54) CMI-CODE CODING METHOD, CMI-CODE DECODING METHOD, CMI CODING CIRCUIT, AND CMI DECODING CIRCUIT

(75) Inventor: Yoichi Nagata, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/087,425

(22) Filed: Feb. 28, 2002

(65) Prior Publication Data

US 2003/0117303 A1 Jun. 26, 2003

(30) Foreign Application Priority Data

Dec. 20, 2001 (JP) ......................... 2001-386921

(51) Int. Cl.[7] ............................... H03M 5/14
(52) U.S. Cl. ............................ 341/73; 341/50
(58) Field of Search ................... 341/73, 50, 51, 341/67

(56) References Cited

U.S. PATENT DOCUMENTS 4,651,328 A  * 3/1987 den Hollander et al. ...... 375/25

FOREIGN PATENT DOCUMENTS

| JP | 61102852 A | 5/1986 |
| JP | 02260840 A | 10/1990 |
| JP | 03042933 A | 2/1991 |
| JP | 08018611 A | 1/1996 |

OTHER PUBLICATIONS

Miura et al. "Small Capacity Optical Fiber Transmission System—F–6M, FS–1.5M, FS–6M system," Shisetsu 36:117–127, 160 (1984).

Nagata et al. "Call–by–Call Activation Technique for Fiber–Optic Subscriber Transmission Units," IEEE Transactions on Communications 35:1297:1302 (1987).

Proceedings of 1982 General Convention of the Institute of electronics and Communication Engineers, Kanagawa–ken, Japan, 2186, pp. 8–226 (1982).

International Telecommunications Union Recommendation G.703: "Physical/electrical characteristics of hierarchiacal digital interfaces," pp. 41–42 (1998).

* cited by examiner

Primary Examiner—Peguy JeanPierre
Assistant Examiner—Joseph J Lauture
(74) Attorney, Agent, or Firm—Townsend and Townsend and Crew LLP (57) ABSTRACT

A CMI coding method, a CMI decoding method, a CMI coding circuit, and a CMI decoding circuit which do not adversely affect a main signal to be CMI-coded and which allow a high-speed asynchronous signal to be always transmitted by Coding Rule Violation, with a simple procedure and a simple hardware structure are provided. A CMI coding method is used in which an asynchronous signal is superposed on a main signal with the use of only CRV0 as CRV. In addition, when the main signal is replaced with CRV0 for a signal to be superposed, since the main signal cannot be transmitted, the CMI coding method is configured such that two bits of the main signal, which should be originally transmitted in a time slot (CRV-indication time slot) in which CRV0 is to be disposed and in the next time slot thereof, are two-bit-coded according to a predetermined rule, and the two-bit code is transmitted by the use of the first half and the second half of the next time slot (crammed main-signal time slot).

24 Claims, 8 Drawing Sheets

CMI-CODE CODING METHOD, CMI-CODE DECODING METHOD, CMI CODING CIRCUIT, AND CMI DECODING CIRCUIT

CROSS-REFERENCE TO RELATED APPLICATIONS

This application claims priority from Japanese Application No. 2001-386921, filed Dec. 20, 2001.

BACKGROUND OF THE INVENTION

1. Field of the Invention

The present invention relates to digital-signal coding and decoding, and more particularly, to coding and decoding of digital signals with the use of a Coded-Mark-Inversion (CMI) code.

2. Description of the Related Art

In the CMI code specified by Recommendation G.703-Annex A of the International Telecommunication Union (ITU-T) and others, block encoding is performed such that a "0 (L)" bit having a period of T in a binary digital signal (having "0" or "1", or "L" or "H") is converted to two bits "01 (LH)", each bit having a period of T/2, and a "1 (H)" bit having a period of T is converted alternately to two bits "00 (LL)" and two bits "11 (HH)", each bit having a period of T/2. In the present specification, a bit having a period of T or two bits each having a period of T/2 is called a time slot in some cases.

With the use of the CMI code, the transmission rate of a digital signal is substantially doubled. However, bit sequence independence (BSI) is obtained for consecutive 0's and consecutive 1's in an input signal, the size of hardware required for coding/decoding can be reduced, and transmission errors can be easily checked by code rule checking. The CMI code has been widely used in small- and medium-capacity fiberoptic transmission systems, intra-office transmission systems, fiberoptic access systems, optical data links, and others having transmission rates from several megabits per second to several tens of megabits per second.

The CMI code is a code with redundancy, in which the code is made to superpose a lower speed signal than the main, according to a rule called coding rule violation (CRV). More specifically, CRV is used for a system to transmit a supervisory signal, an 8-kHz frame signal, a voice signal, or a data signal by superimposing them on a main signal. CRV includes CRV0, in which "0 (L)" in the main signal is coded to "10 (HL)", and CRV1, in which "1 (H)" in the main signal is coded to either "11 (HH)" or "00 (LL)", whichever has the same polarity as a code to which the previous "1" was coded.

In the above description, signal states "0" and "1" are associated with "L" and "H", respectively. Depending on a component (such as that formed by ECL) actually used for a CMI coding circuit/decoding circuit, signal states "0" and "1" may be associated with "H" and "L", respectively. In this case, "L" and "H" in the above description should be read reversely. The above relationships also apply to the following description of the present specification.

As a system in which the CRV technique is applied to the CMI code, such as a fiberoptic transmission system, a synchronous CRV superposition (transmission) system is generally used, in which a signal to be superposed by the CRV technique is synchronized with the main signal, the transmission side forms CRV frames to superpose the signal, and the receiving side detects a CRV-frame synchronization pattern to extract the signal.

To superpose an asynchronous signal on the main signal, and to perform CRV superposition by a simpler configuration than the synchronous CRV superposition (transmission) system, an asynchronous CRV superposition (transmission) system has been examined, which does not require CRV-frame synchronization. As an example, a scheme is shown in FIG. 4 of "Asynchronous Superposition Technique of Low Speed Signal Upon CMI-Coded Main Signal Using Coding Rule Violation", Proceedings of 1982 General Convention of the Institute of Electronics and Communication Engineers, Kanagawa, Japan, p. 2186, in which, in order to superpose an asynchronous signal on the main signal, the asynchronous signal to be superposed is sampled each m (positive integer) bits of the main signal, CRV is applied when the sampled data is "1 (H)", and CRV is not applied when the sampled data is "0 (L)".

Figure 11:
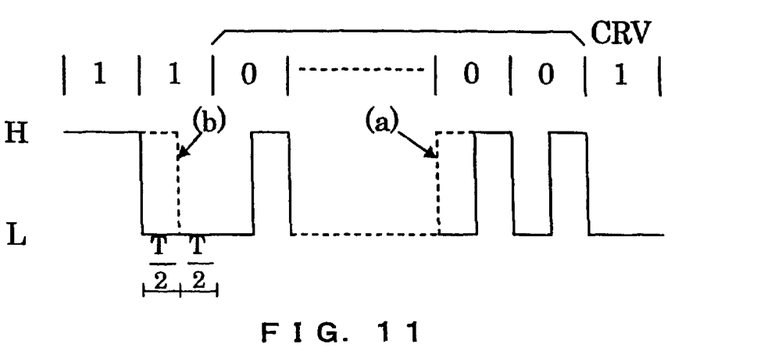
FIG. 11 is a view showing a conventional CMI code, including CRV.

In the asynchronous CRV superposition (transmission) system, it is not easy for the receiving side to differentiate a CRV-indication time slot from a time slot having a transmission error. More specifically, in the asynchronous CRV superposition (transmission) system, when there is CRV1 preceded by n (positive integer) consecutive 0's further preceded by "1" (indicated by a solid line), as shown in FIG. 11, if one bit indicated by (a) in the consecutive 0's or the foregoing "1" indicated by (b) suffer transmission error (indicated by dotted lines), CRV1 is erroneously recognized as "1 (H)". In the case of (b), the foregoing "1" is erroneously recognized as CRV0. In other words, a CRV discrimination error is propagated (spread). When bad conditions exist on a transmission line, the quality of a superposed signal regenerated at the receiving side may deteriorate.

The asynchronous CRV superposition (transmission) system superposes an asynchronous signal having a lower speed than the main signal. To improve the performance of the transmission system, it is preferred that communications be performed by superposing a signal having as high a speed as possible. In other words, there are demands for development of a signal coding/decoding system which does not adversely affect the main signal and which allows a high-speed asynchronous signal to be transmitted with high quality.

SUMMARY OF THE INVENTION

It is an object of the present invention to provide a CMI coding method, a CMI decoding method, a CMI coding circuit, and a CMI decoding circuit which do not adversely affect a main signal and which always allow an asynchronous signal having as high a speed as possible to be superposition-transmitted by CRV of the CMI code, with a simple procedure and a simple hardware structure.

In a CMI coding method according to the present invention, an asynchronous signal is superposed on a main CMI-coded signal with the use of only CRV0 as CRV. In addition, when the main CMI-coded signal is replaced with CRV0 for a signal to be superposed, since the main signal cannot be transmitted, the CMI-code coding method is configured such that two binary bits of the main signal, which should be originally CMI-coded and transmitted in a time slot in which CRV0 is to be disposed and in the next time slot thereof, are two-bit-coded according to a predetermined rule, and the two-bit code is transmitted by the use of the first half and the second half of the next time slot.

In the present specification, a time slot in which CRV is disposed is called a CRV-indication time slot. The next time slot of a CRV-indication time slot, in which a two-bit-coded code by a coding method according to the present invention is disposed, is called a crammed main-signal time slot. A CRV-indication time slot and the crammed main-signal time slot may be collectively called extra time slots.

More specifically, in the CMI coding method, whether CRV0 is substituted for the main CMI-coded signal is determined according to the state of a signal to be superposed. For example, when the signal polarity to be superposed is positive (it has a level of "1" or "H"), it is determined that CRV0 is disposed. Instead of the main CMI-coded signal, CRV0 ("HL") which is a two-bit code, the two bits having opposite polarities to those of a two-bit code ("LH") in which each bit has a period of T/2 and in which the two bits indicate a main signal state of "0" or "L" is disposed as required. In the next time slot of the time slot where CRV0 is disposed, a code is, disposed which is coded such that, when two binary bits of the main signal, which should be originally CMI-coded and transmitted in the time slot where CRV0 is to be disposed and in the next time slot thereof, have the same polarity, the two bits of the main signal are coded to a two-bit code, each bit having a period of T/2 and different polarity from each other.

A CMI decoding method according to the present invention performs processing in the order reverse to that of the CMI coding method described above. More specifically, when CRV0 is detected in a received CMI code, it is discriminated that a signal different from the main signal has been superposed, and a two-bit code disposed in the time slot next to the time slot where CRV0 is disposed is decoded to the original two bits of the main signal. In addition, a pulse having a predetermined time width is generated according to the CRV discrimination, and the signal superposed on the main signal at the coding side is regenerated from these pulses.

The CMI coding and decoding methods described above are the same as the conventional CMI coding and decoding methods except for extra time slots.

A CMI coding circuit for converting a main signal and a signal to be superposed to a CMI code includes a sampling circuit for sampling the signal to be superposed at a redetermined period, and a coder for converting the main signal and.sampled low speed signal to the CMI code. The coder converts the main signal to the conventional CMI code, while, according to the sampled result, CRV0 is disposed in a certain time slot (CRV-indication time slot), and two binary bits of the main signal, which are originally positioned at the CRV-indication time slot and in the crammed main-signal time slot, are converted-to a code according to a particular CMI coding rule and disposed in the crammed main-signal time slot.

A CMI decoding circuit for regenerating the original signals from a CMI code in which a low speed signal is superposed on a main signal includes a decoder for converting a received CMI code to the main signal and picking CRV0s up; and a low speed signal regenerator for regenerating the low speed signal from the picked up CRV0s according to a predetermined rule. The decoder converts the received conventional CMI code portion to the main signal, while detects CRV0s and converts a code disposed in the time slot (crammed main-signal time slot) after a time slot where CRV0 is disposed to two binary bits of the main signal according to a particular CMI coding rule. The low speed signal regenerator regenerates the low speed signal according to a predetermined rule.

DESCRIPTION OF THE PREFERRED EMBODIMENTS

A CMI coding method, a CMI decoding method, CMI coding circuits, and CMI decoding circuits according to embodiments of the present invention will be described below in detail by referring to the drawings.

Figure 1:
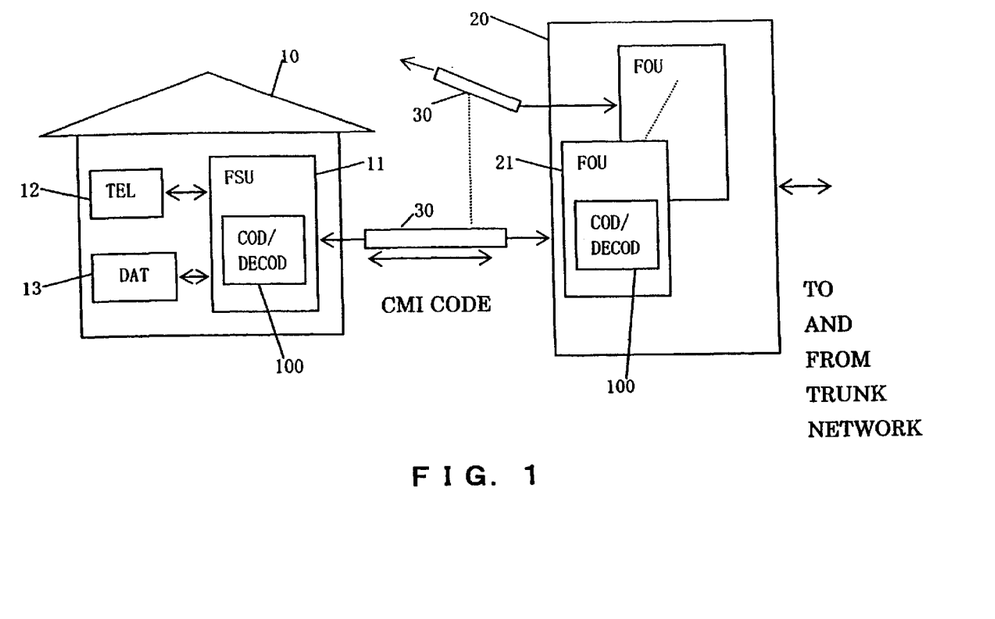
FIG. 1 is a view showing an example structure of a transmission system.

FIG. 1 is a view of an example structure of a transmission system in which a CMI coding method, a CMI decoding method, a CMI coding circuit, and a CMI decoding circuit are used.

Subscriber premises 10 are provided with a fiber-optic subscriber unit (FSU) 11. A synchronous terminal (TEL) 12 for handling a synchronous signal, such as a telephone, and a terminal (DAT) 13 for handling an asynchronous signal such as data, are connected to the FSU 11. An office 20 is provided with a fiber-optic office unit (FOU) 21 similar to the FSU 11 provided for the subscriber premises 10, and performs communications with the terminals 12 and 13 disposed in the subscriber premises 10. The subscriber premises 10 are connected to the office 20 with a transmission line 30, such as optical fiber cable. A signal is transferred between the subscriber premises 10 and the office 20 by the use of the CMI code coded by a CMI coding method of the present invention.

The coding method and the decoding method of the present invention are used for a coding circuit (COD) and a decoding circuit (DECOD) 100 provided for each of the FSU 11 and the FOU 21, which are provided for the subscriber premises 10 and the office 20, respectively. For example, a synchronous signal in the terminal 12 is coded as a main signal used for the CMI code and is transmitted from the FSU 11 while an asynchronous signal in the terminal 13 is superposed on the main signal by CRV according to the coding method of the present invention and is then transmitted. In the office 20, the FOU 21 regenerates the main signal and the superposed signal and uses them within the office 20 or transmits them to a trunk network or to other subscriber premises.

Figure 2:
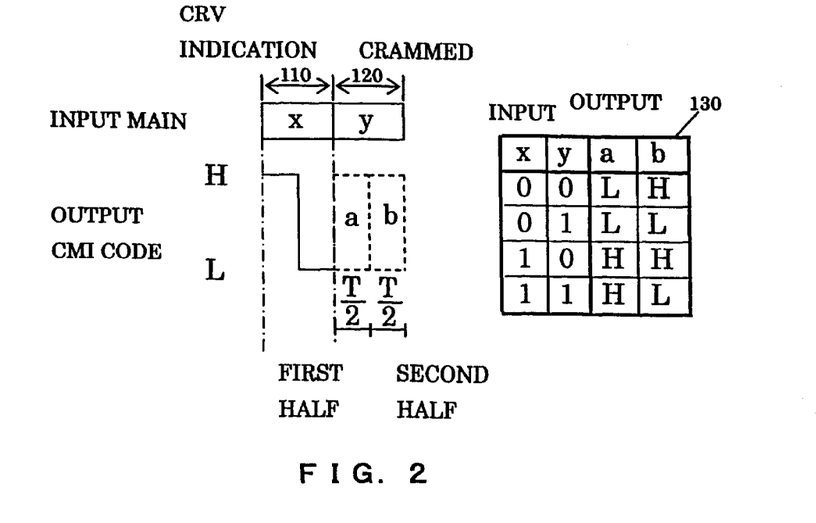
FIG. 2 is a view showing an operation performed in a CMI coding method and a CMI decoding method according to an embodiment of the present invention.

FIG. 2 is a view showing the operation of the CMI coding method and the CMI decoding method (rule) according to the present invention. In the CMI coding method of the present invention, only CRV0 ("HL") is used for superposing an asynchronous signal on the main signal. Depending on the polarity of an asynchronous signal to be superposed, the main CMI-coded signal originally disposed at a time slot (x) 110 is replaced with CRV0 according to a predetermined rule. More specifically, when an asynchronous signal to be superposed is "1", CRV0 is inserted in the time slot (x) 110 instead of the main CMI-coded signal, and when the asynchronous signal is "0", the main CMI-coded signal remains in the time slot (x) 110. The relationship between whether a signal to be superposed is "0" or "1" and whether CRV0 is inserted or not can be reversed to that described above.

Since the main signal cannot be transmitted in the CRV-indication time slot 110, where CRV0 has been disposed, two binary bits of the main signal x and y, which should be originally CMI-coded and transmitted in the CRV-indication time slot 110 and the next time slot (crammed main-signal time slot) 120 thereof, are coded as two bits "a" and "b", as shown in a truth table 130 of FIG. 2, and the bits "a" and "b" (each having a period of T/2) are input to the first half and the second half of the crammed main-signal time slot 120 following the CRV-indication time slot, as shown in FIG. 2.

When the two main signal bits x and y have the same polarity, the coded bits "a" and "b" should have different polarities from each other in order to avoid two consecutive main-signal bit errors caused by a transmission error. If such coding as a=b=L for x=y=0 be applied, the receiving-side erroneously decodes as x=y=1 due to a transmission error on CRV0. To avoid this phenomenon, a CMI coding method and a CMI decoding method according to the present invention use the coding rule shown in FIG. 2.

In the CMI-code decoding method of the present invention, the CRV-indication time slot 110 is detected to extract the superposed asynchronous signal, and two coded bits "a" and "b" in the crammed main-signal time slot 120 are decoded to the original main signal bits x and y according to the rule shown in FIG. 2.

When a transmission error occurs in the CRV-indication time slot 110 in the above-described CMI coding method and decoding method, the receiving side decodes this time slot to "1", and decodes the crammed main-signal time slot to "1" if the first half and the second half have the same polarity, and to "0" if they have different polarities, except the case the crammed main-signal time slot pattern is "HL". In other words, only one bit in the main signal, disposed in either the time slot 110 or the time slot 120, is erroneously decoded. If the crammed main-signal time slot pattern is "HL", this time slot is regarded as a CRV-indication time slot. Since the period of superposed low-speed asynchronous signal is much longer than T, the phase of the regenerated superposed signal is almost unchanged even if the CRV position is shifted backwards by one bit. In this case, the time slot next-to the crammed main-signal time slot is regarded as a crammed main-signal time slot, and only one main signal bit is erroneously decoded. If an error occurs in the crammed main-signal time slot, either crammed main signal bit is erroneously decoded.

If the time slot immediately before the extra time slots indicates "1", and is erroneously received as "HL" pattern, the CRV position is shifted forward by one bit. This is not a big problem, like the above-described one-bit backward shift of the CRV position. When the crammed main-signal time slot has a pattern other than "HL", either crammed main signal bit-is erroneously decoded, as in the above case. When the crammed main-signal time slot has an "HL" pattern, three consecutive "HL" patterns appear. In this case, if the receiving side regards the last "HL" pattern as "1", main signal decoding error is avoided.

In a case the receiving side erroneously detects CRV0in spite of no CRV indication transmission, only one bit in the main signal is erroneously decoded, as in the above error case. Noises in the regenerarted superposed signal due to CRV discrimination error can be easily removed by digital filtering, as described later.

According to the CMI coding method and the CMI decoding method of the present invention, smaller time slots are affected by transmission errors than conventional CRV scheme. A transmission error results in only one main signal bit and single CRV discrimination error. A CRV discrimination error is not propagated as conventional CRV scheme. More specifically, when the transmission bit error rate is P (<<1), whereas the CRV discrimination error rate of conventional CRV scheme is 2.5P, it is reduced to from 0.5P to 1.5P by the present invention. A CRV-indication time slot-can be inserted every 12 bits of the main signal. With a suitable coding and decoding circuit configuration described later, an asynchronous signal having a speed up to about 4% of that of the main signal can be superposed and transmitted.

Figure 3:
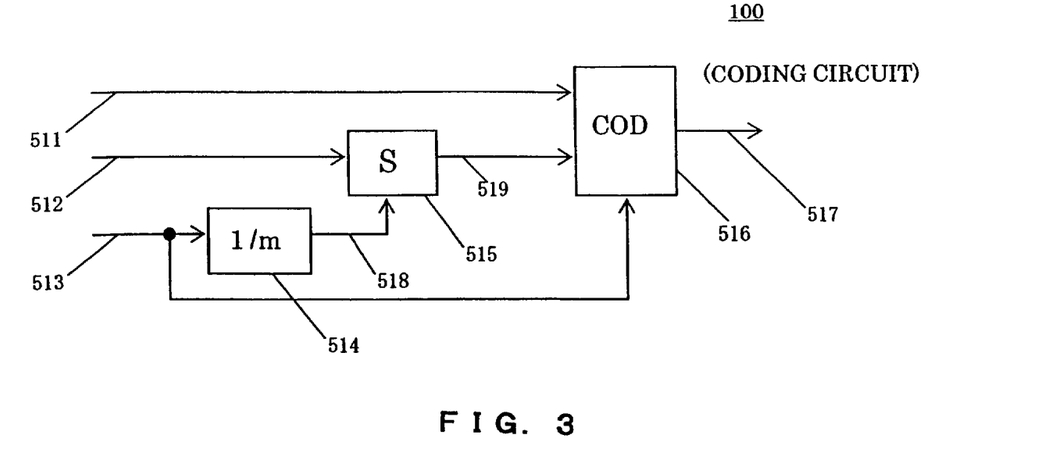
FIG. 3 is a block diagram of a CMI coding circuit according to the embodiment of the present invention.
Figure 4:
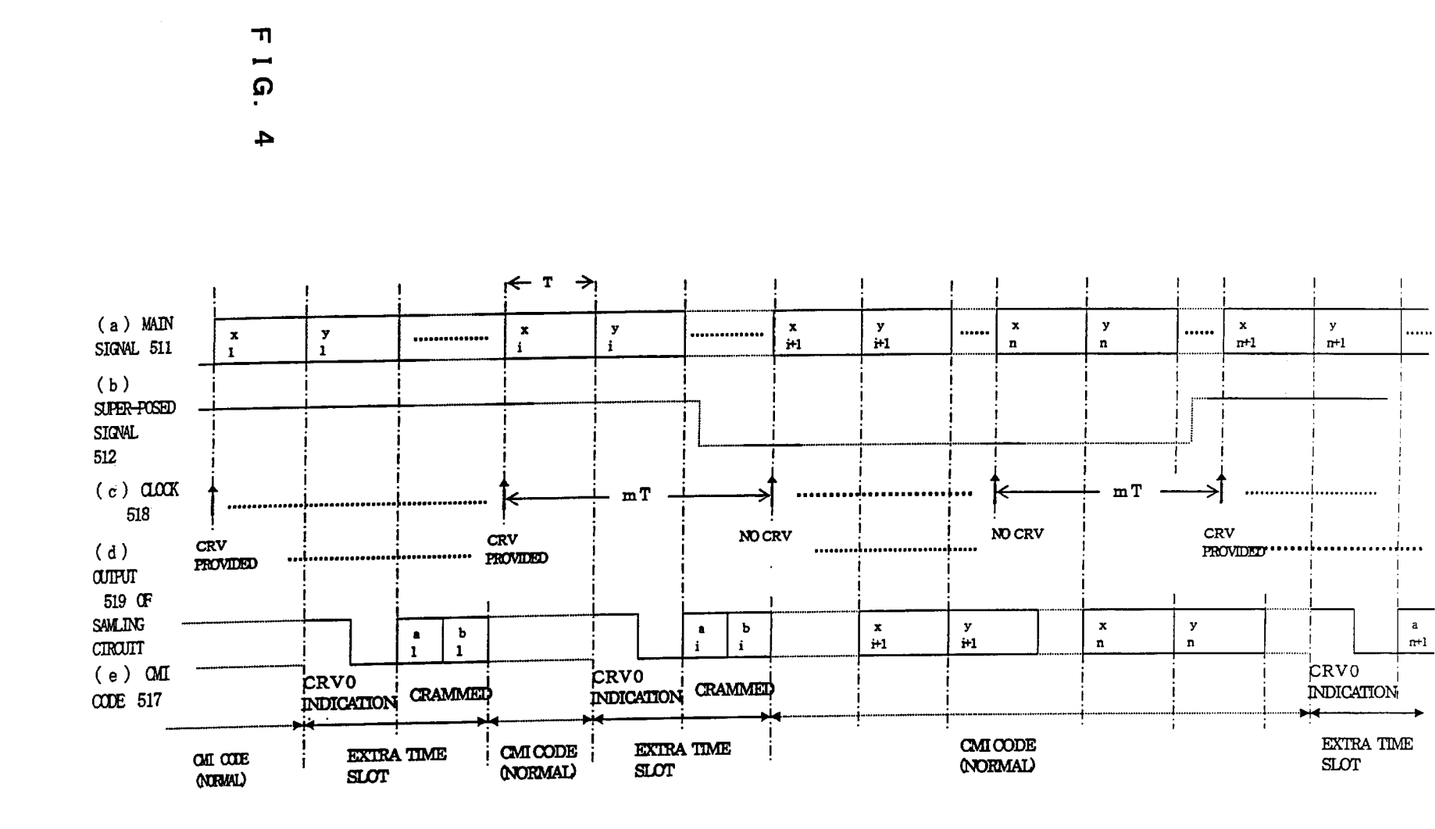
FIG. 4 is a timing chart showing the operation of the CMI coding circuit shown-in FIG. 3.

FIG. 3 is a block diagram showing an example structure of a CMI coding circuit. FIG. 4 is a timing chart showing the operation of the CMI coding circuit illustrated in FIG. 3.

A CMI coding circuit 100 according to the present invention is formed of a clock frequency divider 514 for dividing an operating clock (having a period of T/2 or T) required for CMI coding by a factor "m" (positive integer, set to "2m" when the clock period is T/2), a sampling circuit (S) 515 for sampling an asynchronous signal 512 (indicated by FIG. 4(b))(for example, the output of the terminal 13 shown in FIG. 1) to be superposed on the CMI code, by a clock 518 (indicated by FIG. 4(c)) generated by the clock frequency divider 514, and a CMI coder (COD) 516 for coding the main signal 511 (such as, the output of the terminal 12 shown in FIG. 1, indicated by FIG. 4(a)) and indicating CRV according to the output 519 (indicated by FIG. 4(d)) of the sampling circuit(S) 515 in order to superpose the signal 512 on the main signal 511 according to the CMI coding rule (shown in FIG. 2) of the present invention. The clock frequency divider 514 could be removed, instead another clock having a predetermined period could be input to the sampling circuit 515.

Figure 12:
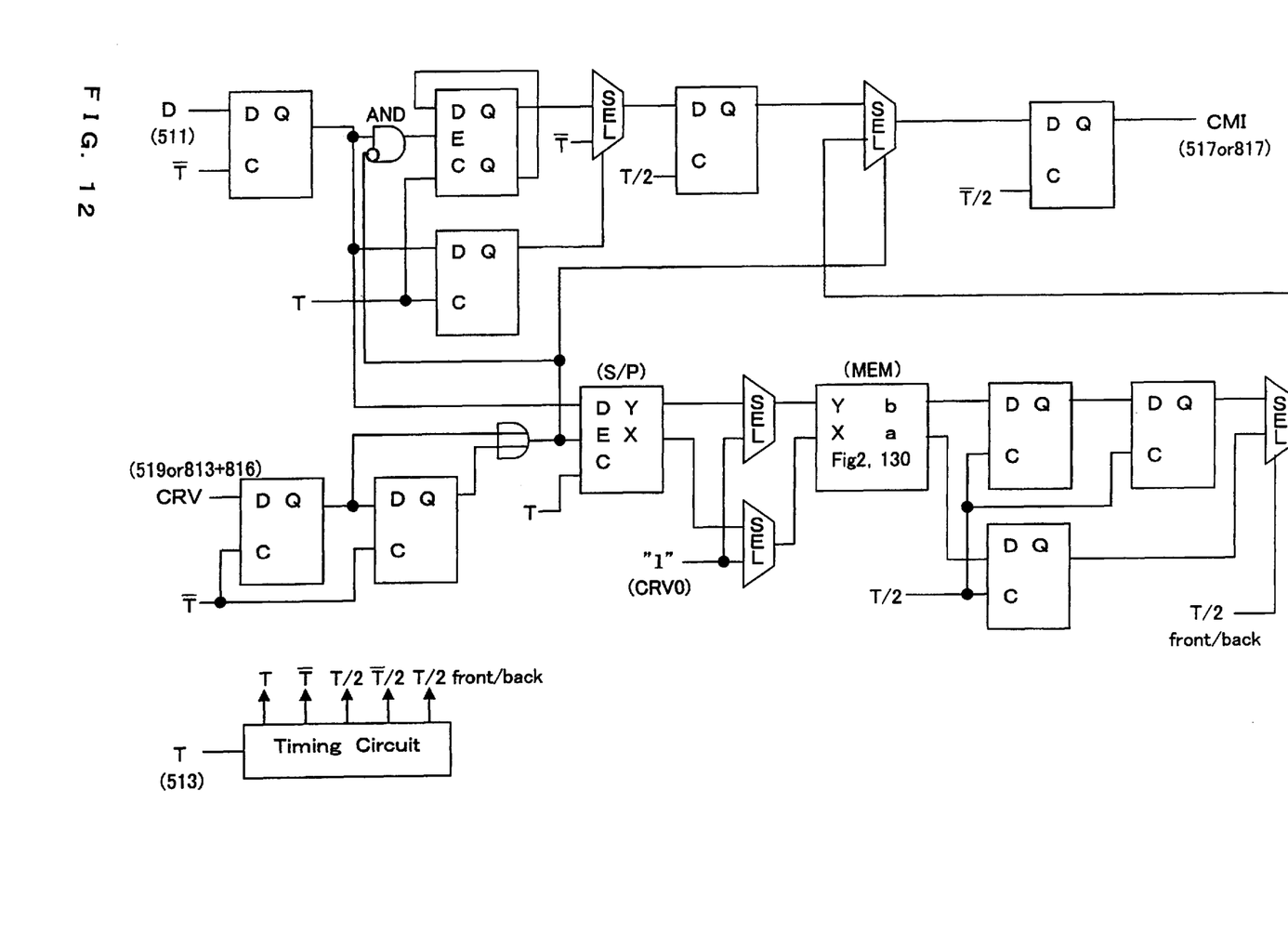
FIG. 12 is a block diagram of a coder used in the CMI coding circuit according to the present invention.

The main function of the CMI coder 516 is main signal CMI encoding and CRV superposition. According to the output 519 of the sampling circuit 515, when the signal 512 to be superposed is "1", the CMI coder 516 inserts CRV0 into the corresponding position in the main signal to change the time slot to a CRV-indication time slot, and codes two main signal bits, which should be originally CMI-coded and transmitted in the extra time slots, according to the truth table 130 shown in FIG. 2 and places the results on the crammed main-signal time slot. When the signal 512 to be superposed is "0", the CMI coder 516 performs conventional CMI coding. The CMI coder 516 outputs a CMI code 517 (indicated by FIG. 4(e)) in which the asynchronous signal has been superposed according to the present invention. The relationship between the output ("0" or "1") of the sampling circuit 515 and whether CRV0 is inserted or not in the coder 516 may be reversed. The CMI coder 516 is a logical circuit which satisfies the truth table shown in FIG. 2, and includes logical gates and flip-flops (FF) for temporarily holding data as included in the conventional CMI coder. The CMI coder 516 may include a microprocessor and firmware to implement the truth table. FIG. 12 shows a block diagram of an example structure thereof.

Figure 5:
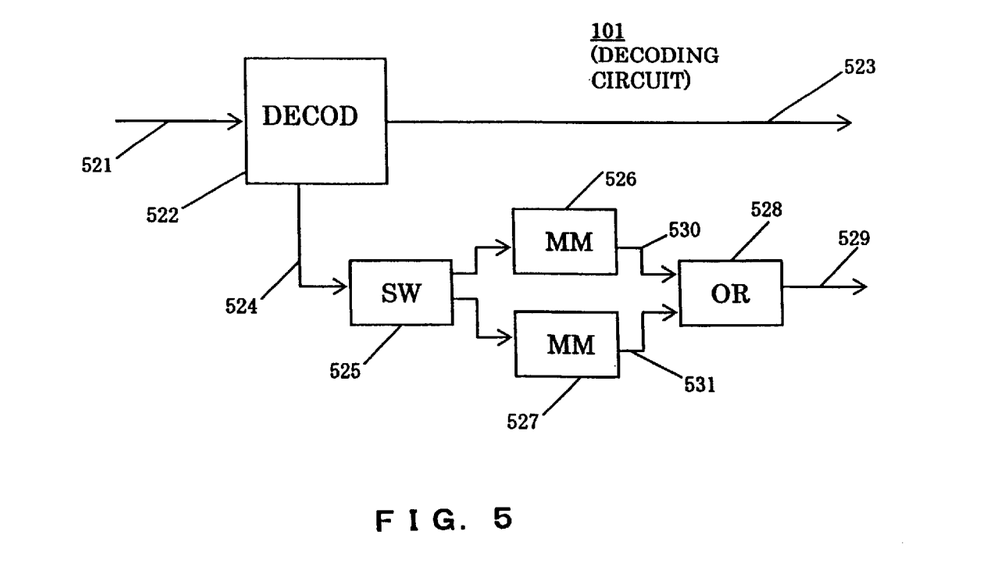
FIG. 5 is a block diagram of a CMI decoding circuit according to the embodiment of the present invention.
Figure 6:
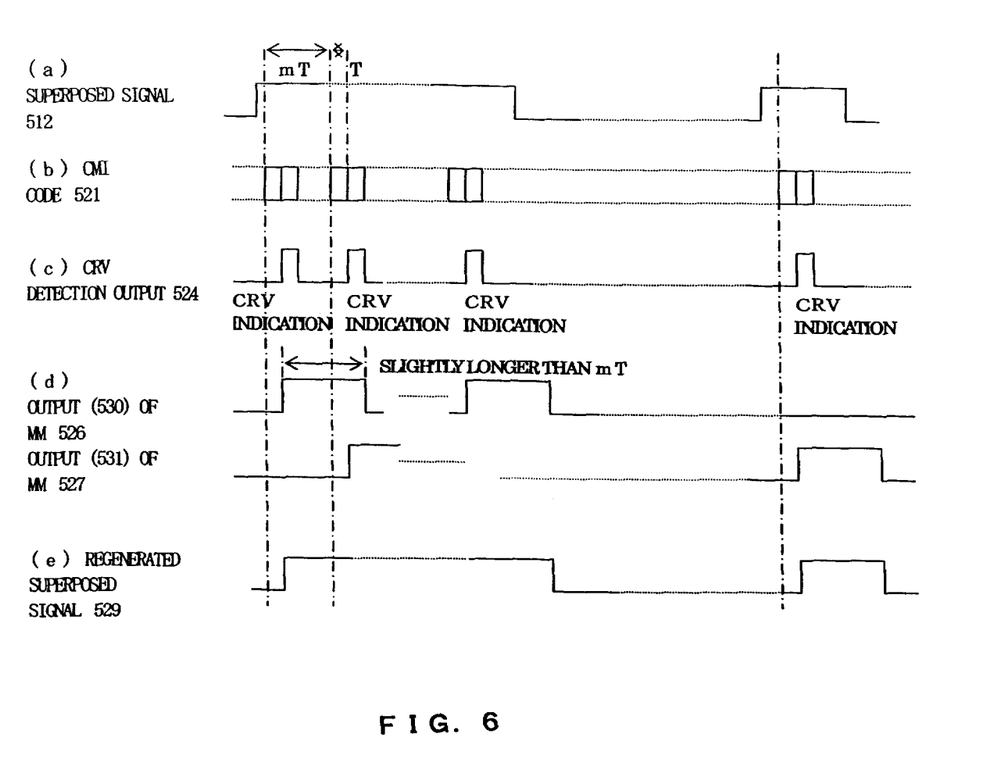
FIG. 6 is a timing chart showing the operation of the CMI decoding circuit shown in FIG. 5.

FIG. 5 is a block diagram showing an example structure of a CMI decoding circuit. FIG. 6 is a timing chart showing an operation of the CMI decoding circuit illustrated in FIG. 5.

The CMI decoding circuit 101 according to the present invention is formed of a CMI decoder (DECOD) 522 for detecting extra time slots (time slots indicated by solid lines in FIG. 6(b)) in a received CMI code 521 which has been generated by the CMI coder 516, for outputting CRV detection output 524 (indicated by FIG. 6(c)), and for decoding a signal in a crammed main-signal time slot to binary two bits in the main signal 523 according to the rule defined in the truth table 130 shown in FIG. 2, a switch (SW) 525 for switching the CRV detection output 524, a plurality of monostable multivibrators (MMs) 526.and 527 disposed in parallel for generating pulses having a predetermined time width according to the output of the switch 525, and a logical OR circuit (OR) 528 for taking the logical OR of the outputs of the monostable multivibrators 526 and 527 to output a regenerated superposed signal 529 which corresponds to asynchronous signal 512.

Figure 13:
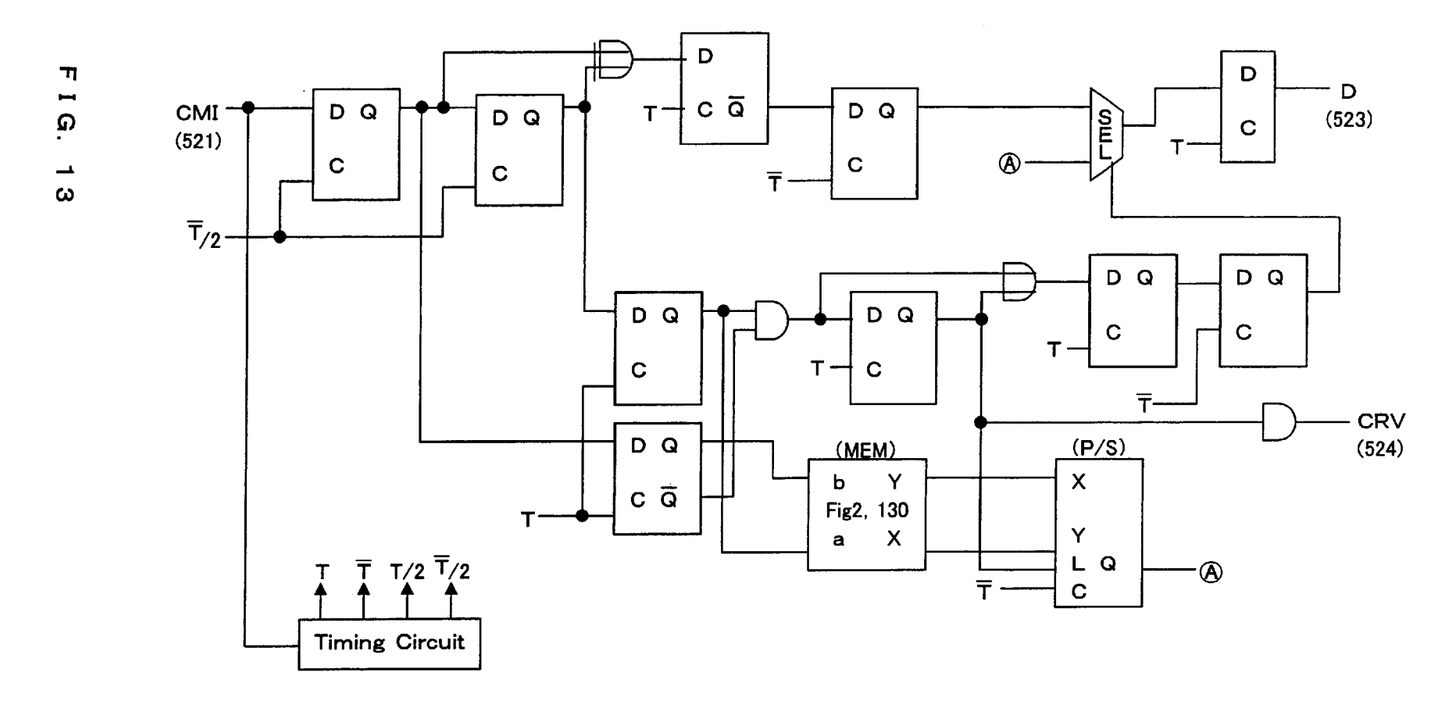
FIG. 13 is a block diagram of a decoder used in the CMI decoding circuit according to the present invention.

The CMI decoder 522 performs.CRV0 detection, two-bit decoding in a crammed main-signal time slot, and conventional main signal CMI-code decoding in the reverse order to that used in the CMI coder 516. The CMI decoder 522 is a logical circuit which satisfies the truth table shown in FIG.2, includes logical gates and flip-flops for temporarily holding data. The CMI decoder 522 may include a microprocessor and firmware to implement the truth table. FIG.13 shows a block diagram of an example structure thereof.

The CRV detection output 524 indicating the state of the superposed asynchronous signal is alternately sent to the monostable multivibrators 526 and 527 by the switch 525. When the CMI coding circuit operates as described above, if the asynchronous signal 512 input to the CMI coding circuit is "1", the CMI decoder 522 detects CRV0 and outputs a CRV detection output 524. Each monostable multivibrator 526, 527 outputs a pulse (indicated in FIG. 6(d)) slightly wider than mT when triggered by the switch 525, and the OR gate 528 takes the logical OR thereof to obtain a regenerated superposed signal 529 (indicated by FIG. 6(e)), which corresponds to the asynchronous signal 512 (indicated by FIG. 6(a)). When the relationship between the output ("0" or "1") of the sampling circuit 515 and whether CRV0 is inserted or not in the CMI coder 516 is reversed, the CMI decoding circuit needs to be partly changed to regenerate superposed asynchronous signal correctly.

Although in the foregoing explanation, the CMI coding circuit and the CMI decoding circuit have been separately described, these circuits may be integrated in one LSI.

Figure 7:
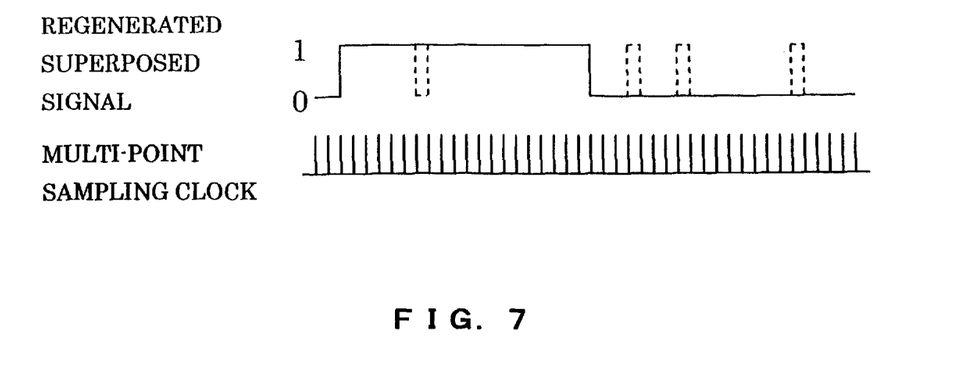
FIG. 7 is a view showing a signal regenerated by the CMI decoding method.

FIG. 7 is a timing chart showing an example of regenerated superposed signal, which is output of the CMI decoding circuit. As described before, a CRV detection error may occur due to transmission error. As shown in FIG. 7, this error appears as a noise pulse (indicated by dotted lines) in the regenerated superposed signal 529 (indicated by a solid line). Since this noise pulse is usually isolated, it can be easily removed by applying digital filtering after re-sampling the signal 529. High performance error monitoring of the main signal can be performed by counting CRV1s detected at positions other than extra time slots at the receiving side and adding the number of isolated noise pulses included in the regenerated superposed signal 529, which is counted in the digital filtering. The upper limit of the speed of the superposed signal is about 1% of that of the main signal in the above-described CMI coding and decoding scheme.

Figure 8:
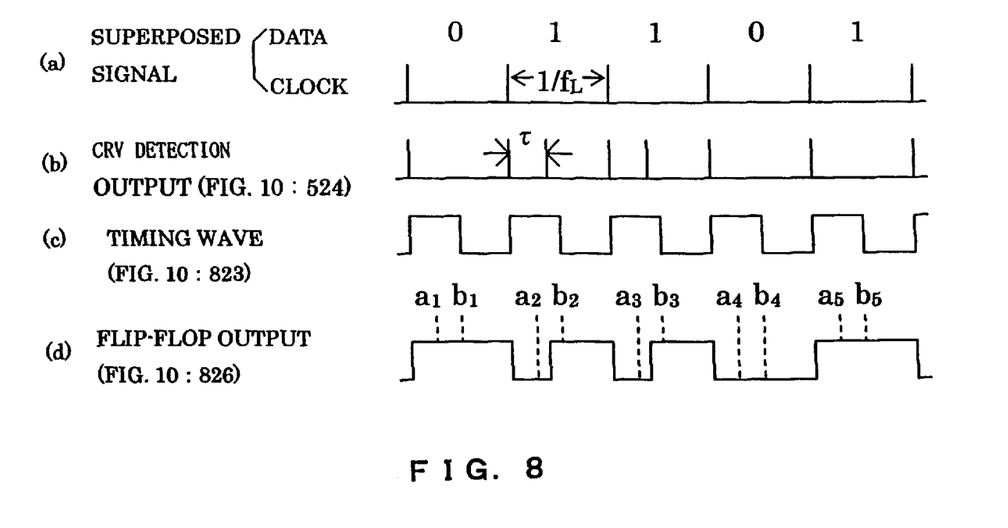
FIG. 8 is a timing chart showing the operation of a CMI coding circuit and a CMI decoding circuit according to another embodiment of the present invention.

When an asynchronous signal to be superposed has a speed of FL and the receiving side has function of extracting FL timing, higher-speed superposition can be performed by a differential method. FIG. 8 is a timing chart showing the operation of a CMI coding circuit and a CMI decoding circuit according to the differential method, which is another embodiment of the present invention.

The coding side performs CRV0 indication at intervals (1/FL) of an operating clock pulse for a signal to be superposed. In addition, when the signal to be superposed is "1", a CRV0 indication is further performed at time τ after the corresponding clock pulse, and when the signal to be superposed is "0", further CRV0 indication is not performed (refer to FIGS. 8(a) and (b)). The operating clock is not needed to be synchronized with the main-signal clock. The time τ is set to be shorter than 1/(2FL). In the same way as in the embodiment described before, the relationship between whether the asynchronous signal to be superposed is "0" or "1" and whether CRV is indicated or not may be reversed.

The decoding side triggers a monostable multivibrator (MM) every time CRV is detected, to generate a timing wave of period 1/FL (indicated by FIG. 8(c)). More specifically, the output of the monostable multivibrator (MM) passes through a timing extraction circuit, such as a resonance circuit or a PLL, to remove noise and jitter to obtain a clean timing wave. In addition, the decoding side triggers a flip-flop (FF) every time CRV is detected, discriminates the FF output polarity at phases "a" and "b", and determines that the original superposed signal is "0" in the case of same-polarity, and "1" in the opposite polarity case.

Figure 9:
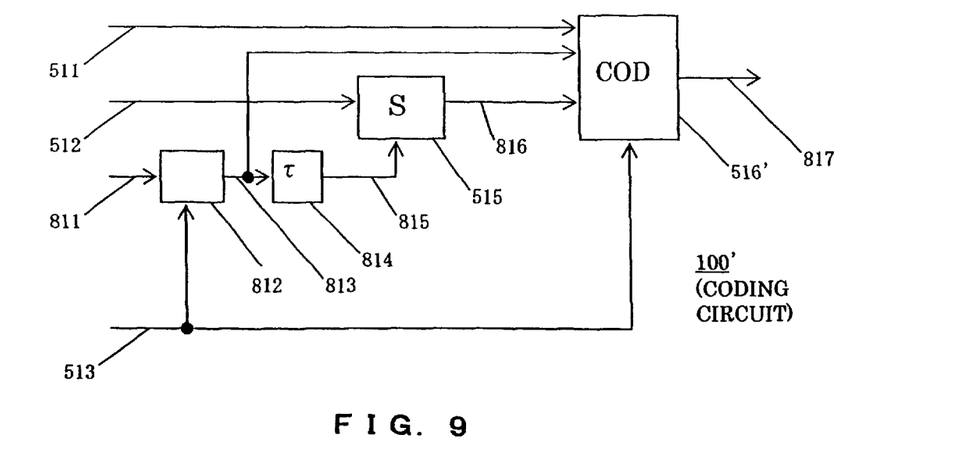
FIG. 9 is a block diagram of the CMI coding circuit according to another embodiment of the present invention.
Figure 10:
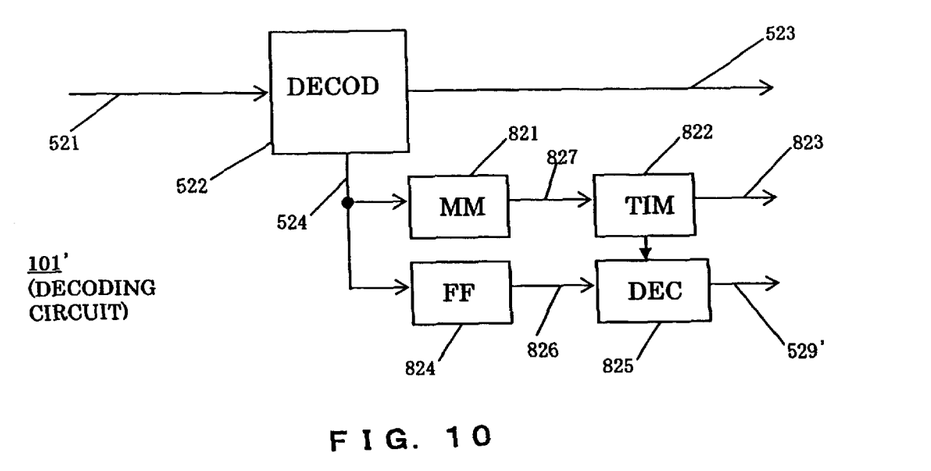
FIG. 10 is a block diagram of the CMI decoding circuit according to another embodiment of the present invention.

FIG. 9 is a block diagram of the CMI coding circuit according to another embodiment of the present invention, which is based on.the differential method. FIG. 10 is a block diagram of the CMI decoding circuit corresponding to the CMI coding circuit shown in FIG. 9, according to another embodiment.

The CMI coding circuit 100' differs from the CMI coding circuit 100 (shown in FIG. 3), described before, in that the clock frequency divider 514 is removed; the CMI coder (COD) 516, which uses the CMI coding method (shown in FIG. 2) of the present invention, is modified.to obtain a CMI coder (COD) 516'; a pulse-rising-edge detector 812 for detecting rising edges of the operating clock 811 of an asynchronous signal 512 to be superposed on a main signal 511, and a delay circuit 814 for delaying the output of.the detector 812 by a predetermined time τ are added.

The detector 812 detects a rising edge of the operating clock 811 to generate a trigger pulse 813. When this trigger pulse 813 is input to the CMI coder,(COD) 516', the CMI coder 516' inserts CRV0 and generates a crammed main-signal time slot by the coding method illustrated in FIG. 2. The trigger pulse 813 is also delayed by the time τ by the delay circuit 814 and is input to a sampling circuit (S) 515.

The sampling circuit 515 samples the signal 512 to be superposed, and sends the sampling result to the CMI coder 516' in the same way as the CMI coding circuit shown in FIG. 3. The CMI coder 516' inserts CRV0 and generates a crammed main-signal time slot by the coding method illustrated in FIG. 2, in the same way as the CMI coding circuit shown in FIG. 3. By the above-mentioned operations, a CMI code 817 according to the present invention is output. The CMI coder 516' is obtained by adding a function of generating extra time slots when the trigger pulse 813 is received, to the CMI coder 516 shown in FIG. 3. In the configuration of taking the logical OR of the trigger pulse 813 and the output 816 of the sampling circuit 515, the CMI coder 516, described before, may be used without modification.

The decoding circuit 101' corresponding to the CMI coding circuit described above is obtained by modifying a superposed-signal regeneration portion of the CMI decoding circuit 101 (shown in FIG. 5) described before. A superposed-signal regeneration section is-formed of a monostable multivibrator (MM) 821, a timing extraction circuit (TIM) 822, a flip-flop (FF) 824, and a decision circuit (DEC) 825 which regenerates the signal 512 superposed by the coding side. The decoder 522 is the same as that used in the decoding circuit shown in FIG. 5.

The monostable multivibrator 821 generates pulses each having a time width of 1/(2FL), triggered by the CRV-detection output 524 of the decoder 522. The timing extraction circuit (TIM) 822 outputs a superposed-signal clock 823 (indicated by FIG. 8(*c*)). The flip-flop (FF) 824 inverts the polarity of its output signal 826(indicated by FIG. 8(*d*)), triggered by the CRV-detection output 524. The decision circuit 825 discriminates the polarity of signal 826 at phases "a" and "b" indicated by FIG. 8(*d*) and determines that-the original asynchronous signal is "0" in the case of same polarity and "1" in the opposite polarity case. The discrimination phases "a" and "b" (timing) are generated by the timing extraction circuit 822.

In the CMI coding circuit and the CMI decoding circuit having the above-described structures, the relationship between the output ("0" or "1") of the sampling circuit 515 and whether CRV0 is inserted or not in the coder 516 may be reversed, as in the CMI coding circuit (shown in FIG. 3) and the CMI decoding circuit (shown in FIG. 5) described before. In this case, by changing the CMI decoding circuit partly, the asynchronous superposed signal can be correctly regenerated. Furthermore, the CMI coding circuit and the CMI decoding circuit may be collectively formed in one LSI. High performance error monitoring of the main signal can be achieved by detecting CRV1s excluding the vicinities of polarity discrimination timing "a" and "b". The upper limit of the speed of the superposed signal is about 4% of that of the main signal in the above-described CMI coding and decoding scheme.

According to the CMI coding method, the CMI decoding method, the CMI coding circuit, and the CMI decoding circuit of the present invention, CRV detection error propagation caused by a transmission error is prevented and superposed asynchronous signal can be transmitted at high performance by using simple coding/decoding hardware.

What is claimed is:

1. A Coded-Marked-Inversion (CMI) coding method for converting a first signal (511) and a second signal (512) to a CMI code (517, 817), comprising the steps of:
   converting the first signal to a CMI code while determining (515, 812) according to a predetermined rule whether the second signal should be superposed on the first CMI-coded signal;
   when the second signal is superposed, converting the first signal in a certain time slot (110) of a plurality of first signal time slots to the first code according to a CMI coding rule different from that applied to the CMI code;
   converting two binary bits of the first signal, the two bits being originally disposed in the time slot (110) where the first code is to be brought and the next time slot (120) thereof, to a second code (130) according to the different CMI coding rule, and inserting the second code into the next time slot; and
   converting the first signal and the second signal to the CMI code (517, 817) and outputting it.

2. A CMI coding method according to claim 1,
   wherein the predetermined rule determines the conversion from the first signal to the first code according to a state of the second signal, and
   the first code is a two bit code, each bit having a period of T/2, where T indicates a period of the time slot, and the two bits having opposite polarities to those of a two bit code in which each bit has a period of T/2 and in which the two bits indicate a signal state "0" or "L" in the CMI code.

3. A CMI coding method according to claim 2, wherein the first signal is converted to the first code when the second signal is in the state of "1" or "H".

4. A CMI coding method according to claim 2, wherein the first signal is converted to the first code when the second signal is in the state of "0" or "L".

5. A CMI coding method according to claim 2, wherein the second code is a two bit code, each bit having a period of T/2, where T indicates the period of the time slot, and having different polarities from each other when two bits of the first signal, which should be originally CMI-coded and transmitted in the time slot where the first code is to be disposed and the next time slot thereof, have the same polarity.

6. A CMI coding method according to claim 1, wherein the first signal is converted to the first code when the second signal is in the state of "1" or "H".

7. A CMI coding method according to claim 1, wherein the first signal is converted to the first code when the second signal is in the state of "0" or "L".

8. A CMI coding method according to claim 1, wherein the second code is a two bit code (130), each bit having a period of T/2, where T indicates a period of the time slot, and having different polarities from each other when two bits of the first signal, which should be originally CMI-coded and transmitted in the time slot where the first code is to be disposed and the next time slot thereof, have the same polarity.

9. A Coded-Marked-Inversion (CMI) decoding method for regenerating a first signal (511) and a second signal (512) from a CMI code (521) in which the second signal is superposed on the first signal, comprising the steps of:
   converting the CMI code to the first signal while, when a first code (115) coded by a CMI coding rule different from that for the CMI code is detected, outputting (522) a signal indicating the detection of the first code; and
   converting a second code (130), disposed in the time slot after a time slot where the first code is disposed, to an output (523) of two binary bits of the first signal according to the different CMI coding rule.

10. A CMI decoding method according to claim 9,
    wherein the first code is a two bit code, each bit having a period of T/2, where T indicates the period of the time slot, and the two bits having opposite polarities to those of a two bit code in which each bit has a period of T/2 and in which the two bits indicate the signal state "0" or "L" in the CMI code.

11. A CMI decoding method according to claim 10,
    wherein, when the first code is detected, a pulse is generated, and the second signal superposed on the first signal is regenerated from the pulse.

12. A CMI decoding method according to claim 9, wherein, when the first code is detected, a pulse (524) is generated according to a result of the detection, and the second signal superposed on the first signal is regenerated (529, 529') from the pulse.

13. A CMI decoding method according to claim 12, wherein the second signal is regenerated by a predetermined rule (525, 526, 527, 528, 821, 822, 824, 825).

14. A CMI decoding method according to claim 9, wherein the second code is a two bit code (130), each bit having a period of T/2, where T indicates a period of the time slot, and having different polarities from each other when two bits of the first signal, which should be originally CMI-coded and transmitted in the time slot where the first code is to be disposed and the next time slot thereof, have the same polarity.

15. A Coded-Marked-Inversion (CMI) coding circuit (100, 100') for converting a first signal (511) and a second signal (512) to a CMI code (517, 817), comprising:
- a sampling circuit (515) for sampling the second signal at a predetermined period;
- a coder (516, 516') for converting the first signal to a CMI code,
- wherein the coder converts the first signal to a CMI code by using a first clock, converts the first signal in a certain time slot (110) to a first code by a CMI coding rule different from that for the CMI code according to the sampling result of the second signal by using a second clock, converts two bits of the first signal originally disposed in the time slot where the first code is to be disposed and the next time slot (120) thereof, to a second code (130) by the different CMI coding rule, and places the second code in the next time slot.

16. A CMI coding circuit according to claim 15,
- wherein the first code is a two bit code, each bit having a period of T/2, where T indicates a period of the time slot, and the two bits having opposite polarities to those of a two bit code in which each bit has a period of T/2 and in which the two bits indicate a signal state "O" or "L" in the CMI code.

17. A CMI coding circuit according to claim 15, wherein the second code is a two bit code (130), each bit having a period of T/2, where T indicates a period of the time slot, having different polarities from each other when two bits of the first signal, which should be originally CMI coded and transmitted in the time slot where the first code is to be disposed and the next time slot thereof have the same polarity.

18. A Coded-Marked-Inversion (CMI) decoding circuit (101, 101') for regenerating a first signal and a second signal from a received CMI code (521) in which the second signal is superposed on the first signal, comprising:
- a decoder (522) for converting the received CMI code to the original signal;
- a low speed signal regenerator (525, 526, 527, 528, 821, 822, 824, 825) for regenerating a signal (529, 529') from the output of the decoder(522) according to a predetermined rule,
- wherein the decoder converts the received CMI code to the first signal, detects a first code coded according to a CMI coding rule different from that used for the received CMI code, and converts a second code disposed in the time slot after a time slot where the first code is disposed to two binary bits of the first signal (523) according to the different CMI coding rule, and the low speed signal regenerator regenerates the second signal, which has been superposed on the first signal at a transmission side, from the decoder(522) output according to the predetermined rule.

19. A CMI decoding method according to claim 18, wherein the second signal is regenerated by a predetermined rule.

20. A CMI decoding circuit according to claim 19, wherein the first code is a two bit code (115), each bit having a period of T/2, where T indicates a period of the time slot, and having opposite polarities to those of a two bit code in which each bit has a period of T/2 and in which the two bits indicated the signal state "0" or "L" in the CMI code.

21. A CMI decoding circuit according to claim 19, wherein the second code is a two bit code (130), each bit having a period of T/2, where T indicates a period of the time slot, and having different polarities from each other when two bits of the first signal, which should be originally CMI-coded and transmitted in the time slot where the first code is to be disposed and the next time slot thereof have the same polarity.

22. A CMI decoding circuit according to claim 19, wherein the low speed signal regenerator comprises a multivibrator or multivibrators for generating pulses having a predetermined time width when the first-code is detected, or a combination of the multivibrator and a flip-flop.

23. A CMI decoding circuit according to claim 19, further comprising a circuit for filtering the second signal regenerated by the low speed signal regenerator, to remove noise pulses due to transmission errors.

24. A CMI decoding circuit according to claim 19, further comprising means for monitoring an error of the first signal according to a result of the detection of a code other than the received CMI code, the first code, and the second code.

* * * * *